United States Patent
Nagatomo et al.

(10) Patent No.: US 8,416,826 B2
(45) Date of Patent: Apr. 9, 2013

(54) PHOTONIC CRYSTAL SURFACE EMITTING LASER

(75) Inventors: Yasuhiro Nagatomo, Kawasaki (JP); Takeshi Uchida, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/061,983

(22) PCT Filed: Apr. 8, 2010

(86) PCT No.: PCT/JP2010/056725
§ 371 (c)(1),
(2), (4) Date: Mar. 3, 2011

(87) PCT Pub. No.: WO2010/128617
PCT Pub. Date: Nov. 11, 2010

(65) Prior Publication Data
US 2011/0158280 A1 Jun. 30, 2011

(30) Foreign Application Priority Data
May 7, 2009 (JP) ................................. 2009-112479

(51) Int. Cl.
*H01S 5/00* (2006.01)
(52) U.S. Cl. .................................... 372/50.1; 372/43.01
(58) Field of Classification Search ............... 372/43.01, 372/50.1
See application file for complete search history.

(56) References Cited

U.S. PATENT DOCUMENTS

| | | | |
|---|---|---|---|
| 6,597,721 B1 * | 7/2003 | Hutchinson et al. ............ | 372/98 |
| 7,009,216 B2 * | 3/2006 | Otsuka et al. ................... | 257/98 |
| 7,295,745 B2 | 11/2007 | Uchida ........................ | 385/129 |
| 7,483,465 B2 * | 1/2009 | Thornton et al. ........... | 372/50.11 |
| 7,499,480 B2 | 3/2009 | Nagatomo ................ | 372/50.124 |
| 7,535,946 B2 | 5/2009 | Nagatomo et al. ....... | 375/50.124 |
| 7,539,226 B2 | 5/2009 | Uchida ....................... | 372/43.01 |
| 7,680,168 B2 | 3/2010 | Uchida ....................... | 372/43.01 |

(Continued)

FOREIGN PATENT DOCUMENTS

| | | |
|---|---|---|
| JP | 07-079048 | 3/1995 |
| JP | 2000-332351 A | 11/2000 |

(Continued)

OTHER PUBLICATIONS

B. Ben Bakir et al., "Surface-emitting microlaser combining two-dimensional photonic crystal membrane and vertical Bragg mirror," Applied Physics Letters, vol. 88, pp. 081113-1 to 081113-3 (Feb. 24, 2006).

*Primary Examiner* — Jessica Stultz
*Assistant Examiner* — Delma R Forde
(74) *Attorney, Agent, or Firm* — Fitzpatrick, Cella, Harper & Scinto

(57) ABSTRACT

The present invention provides a photonic crystal surface emitting laser with which an arbitrary beam shape can be obtained and which enables design with a high degree of freedom. The surface emitting laser including a photonic crystal having a resonance mode in an in-plane direction parallel to a substrate includes a reflecting mirror for reflecting light emitted from the photonic crystal in a normal direction of the substrate and a spacer layer interposed between the reflecting mirror and the photonic crystal, wherein a nonuniform in-plane distribution is provided to the characteristics of one of the reflecting mirror and the spacer layer, so that a Q-value, which is a resonator characteristic in the normal direction of the substrate in the surface emitting laser, has a nonuniform in-plane distribution.

4 Claims, 4 Drawing Sheets

U.S. PATENT DOCUMENTS

| | | | |
|---|---|---|---|
| 7,688,875 B2 | 3/2010 | Uchida | 372/50.12 |
| 7,796,662 B2 | 9/2010 | Uchida et al. | 372/46.013 |
| 7,796,666 B2 | 9/2010 | Nagatomo | 372/50.124 |
| 7,796,668 B2 | 9/2010 | Hori et al. | 372/50.124 |
| 7,807,485 B2 | 10/2010 | Uchida et al. | 438/29 |
| 7,830,944 B2 | 11/2010 | Takeuchi et al. | 372/99 |
| 7,839,912 B2 | 11/2010 | Uchida | 372/50.124 |
| 7,839,913 B2 | 11/2010 | Uchida et al. | 372/50.124 |
| 7,842,530 B2 | 11/2010 | Uchida | 438/39 |
| 7,869,483 B2 | 1/2011 | Uchida et al. | 372/99 |
| 2002/0154675 A1* | 10/2002 | Deng et al. | 372/96 |
| 2003/0021326 A1* | 1/2003 | Liao et al. | 372/96 |
| 2004/0264536 A1* | 12/2004 | Ryou et al. | 372/50 |
| 2007/0121694 A1 | 5/2007 | Okamoto | 372/50.124 |
| 2007/0201526 A1 | 8/2007 | Hori | 372/50.124 |
| 2007/0201527 A1 | 8/2007 | Hori et al. | 372/50.124 |
| 2008/0107145 A1 | 5/2008 | Hori et al. | 372/99 |
| 2008/0205469 A1* | 8/2008 | Imai et al. | 372/50.21 |
| 2008/0285608 A1 | 11/2008 | Hori | 372/44.011 |
| 2008/0298419 A1* | 12/2008 | Hori et al. | 372/50.124 |
| 2009/0074026 A1 | 3/2009 | Nagatomo et al. | 372/50.124 |
| 2009/0196319 A1* | 8/2009 | Hori et al. | 372/50.124 |
| 2009/0225805 A1 | 9/2009 | Nagatomo | 372/99 |
| 2010/0166034 A1* | 7/2010 | Ikuta | 372/46.014 |
| 2010/0226404 A1* | 9/2010 | Kim et al. | 372/50.11 |
| 2011/0134941 A1 | 6/2011 | Hoshino et al. | 372/7 |
| 2011/0134956 A1 | 6/2011 | Nagatomo et al. | 372/50.11 |
| 2011/0216796 A1 | 9/2011 | Nagatomo et al. | 372/45.01 |
| 2011/0249697 A1* | 10/2011 | Brenner et al. | 372/46.01 |
| 2011/0284896 A1* | 11/2011 | Park | 257/98 |

FOREIGN PATENT DOCUMENTS

| | | |
|---|---|---|
| JP | 2004-296538 A | 10/2004 |
| JP | 2007-234824 | 9/2007 |

* cited by examiner

PHOTONIC CRYSTAL SURFACE EMITTING LASER

TECHNICAL FIELD

The present invention relates to a photonic crystal surface emitting laser.

BACKGROUND ART

In recent years, there have been reported many examples in which a photonic crystal is applied to a semiconductor laser. Japanese Patent Application Laid-Open No. 2000-332351 (Patent Document 1) describes a surface emitting laser in which an active layer containing a luminescence material is provided and a two-dimensional photonic crystal is formed in the vicinity of the active layer. This is a type of distributed-feedback (DFB) laser. In this two-dimensional photonic crystal, columnar holes are periodically provided in a semiconductor layer and the refractive index distribution of the photonic crystal has two-dimensional periodicity. This periodicity causes light produced in the active layer to resonate, thereby forming a standing wave and allowing laser oscillation to take place. This laser-oscillated laser light is extracted in a surface normal direction due to primary diffraction caused by the photonic crystal, and the laser operates as a surface emitting laser.

The above-described two-dimensional photonic crystal surface emitting laser is known to have an annular beam shape in which light intensity is low at the central portion of an emitting region and high in the peripheral portion thereof.

However, a unimodal beam shape in which light intensity is high at the central portion is more desirable in some cases for the case of, for example, coupling with a single-mode optical fiber. In order to obtain such a unimodal beam shape, Japanese Patent Application Laid-Open No. 2004-296538 (Patent Document 2) discusses a surface emitting laser light source in which the symmetry of the lattice structure of a two-dimensional photonic crystal is broken by shaping each hole of the two-dimensional photonic crystal into, for example, an equilateral triangle, thereby obtaining a beam shape close to a unimodal beam shape.

DISCLOSURE OF THE INVENTION

In the above-described Patent Document 2, beam shape control is made possible by changing the shape of a hole. However, changing the shape of a hole breaks the symmetry of the lattice structure of the photonic crystal. This affects the efficiency of light extraction in a surface normal direction, thus exerting an effect on, for example, oscillation threshold. That is, in Patent Document 2, changing the shape of a hole in an attempt to obtain an arbitrary beam shape also changes other characteristics of the photonic crystal, causing the problem that the degree of design freedom is low.

In view of the foregoing problem, it is an object of the present invention to provide a photonic crystal surface emitting laser which is higher in the degree of design freedom than the laser light source discussed in Patent Document 2 and in which an arbitrary beam shape can be obtained.

In an embodiment of the invention, there is provided a photonic crystal surface emitting laser comprising: a photonic crystal having a resonance mode in an in-plane direction of a substrate; an active layer located in the vicinity of the photonic crystal and caused to emit light by carrier injection; a reflecting mirror for reflecting light emitted from the photonic crystal in a normal direction of the substrate; and a spacer layer interposed between the reflecting mirror and the photonic crystal, wherein one of the reflecting mirror and the spacer layer is composed so that a Q-value, which is a resonator characteristic in the normal direction of the substrate, has a nonuniform in-plane distribution.

According to the present invention, it is possible to realize a photonic crystal surface emitting laser which is higher in the degree of design freedom than in the case of Patent Document 2 and in which an arbitrary beam shape can be obtained.

Further features of the present invention will become apparent from the following description of exemplary embodiments with reference to the attached drawings.

BEST MODES FOR CARRYING OUT THE INVENTION

Figure 1:
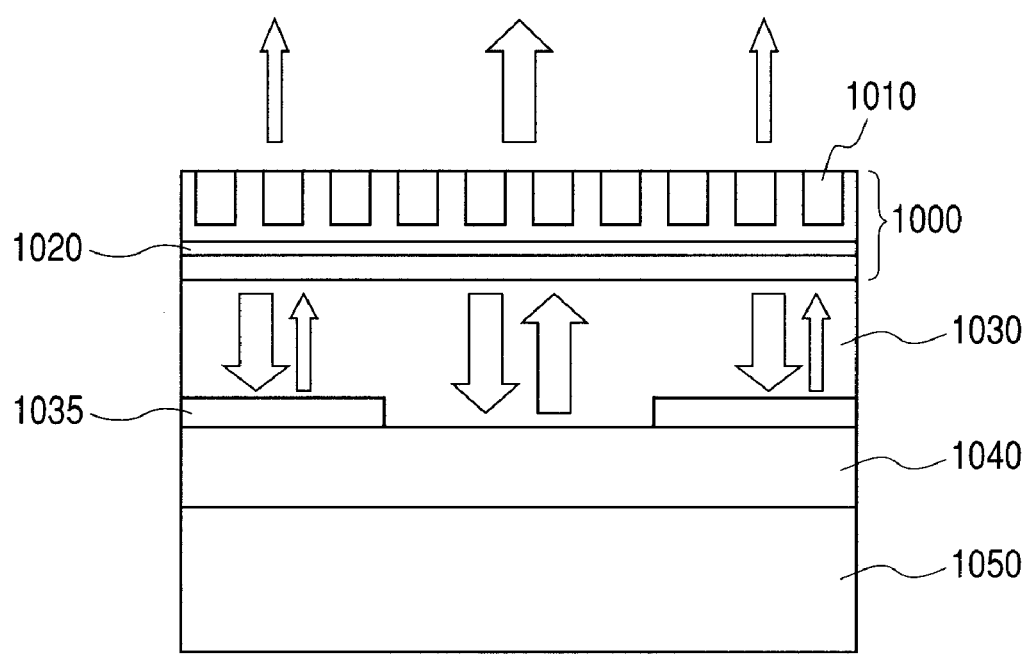
FIG. 1 is a schematic view to describe a photonic crystal surface emitting laser in an embodiment of the present invention.

Now, a structure of a photonic crystal surface emitting laser in an embodiment of the present invention will be described using FIG. 1. Note that in the present specification, a description will be given assuming that the substrate side of a laser element is a lower side and a side opposite to the substrate side is an upper side. The photonic crystal surface emitting laser in the present embodiment includes a two-dimensional photonic crystal 1010 having a resonance mode in the in-plane direction of a substrate 1050. In addition, an optical waveguide layer 1000 includes an active layer 1020 and is designed so that a peak of a light intensity distribution generally lies in the active layer. In the optical waveguide layer 1000, the two-dimensional photonic crystal is provided on at least one side of the active layer 1020. This two-dimensional photonic crystal is formed by periodically disposing, in a plate-like base material, regions having a different refractive index from that of the base material. For example, holes are periodically formed in the plate-like base material. The active layer 1020 and the two-dimensional photonic crystal 1010 may be in contact with each other or another layer may be interposed therebetween. That is, it is enough that the active layer 1020 is located in the vicinity of the two-dimensional photonic crystal 1010. Consequently, light emitted from the active layer due to carrier injection is resonated by the two-dimensional photonic crystal 1010.

As the lattice shape of the photonic crystal, a rectangular lattice, a triangular lattice, a honeycomb lattice, or the like can be used. The lattice constant of the photonic crystal is determined by taking into consideration a wavelength at which laser oscillation is desired to take place and the refractive index of a material. The shape of each lattice point is, for example, circular, triangular, rectangular or hexagonal. Alternatively, one-dimensional photonic crystal may be used.

The photonic crystal functions as a laser resonator. As a parameter representative of the performance of a resonator, a Q-value is commonly used. The Q-value is a parameter related to the dissipation of energy from the resonator. In general, oscillation can be caused at a lower threshold with the increase of the Q-value. Now, let the Q-value of a photonic crystal slab as a resonator be $Q_{total}$. Also let a Q-value in a direction vertical to a substrate surface be $Q_\perp$ and a Q-value in a direction horizontal to the substrate surface be $Q_{//}$. Then, the following relationship is known to hold:

$$1/Q_{total} = 1/Q_\perp + 1/Q_{//}$$

This means that if either $Q_\perp$ or $1/Q_{//}$ or both thereof can be controlled, then the resonance characteristic $Q_{total}$ can be controlled as well.

Adding a reflecting mirror to a photonic crystal laser enables the control of $Q_\perp$. For example, Q-value control can be realized by providing a DBR as a reflecting mirror on the lower side of a two-dimensional photonic crystal surface emitting laser. The principles of such control are considered to be based on interference between light directly emitted from the photonic crystal to the upper side and light reflecting upon and returning from the reflecting mirror. If the abovementioned directly emitted light and reflected and returned light are opposite in phase to each other (with a phase shift of $\pi$) and the same in light intensity with each other, then the light to be emitted to the upper side is completely cancelled and, therefore, cannot be emitted. Consequently, $Q_\perp$, which is a Q-value in a surface normal direction, can be increased.

Figure 2:
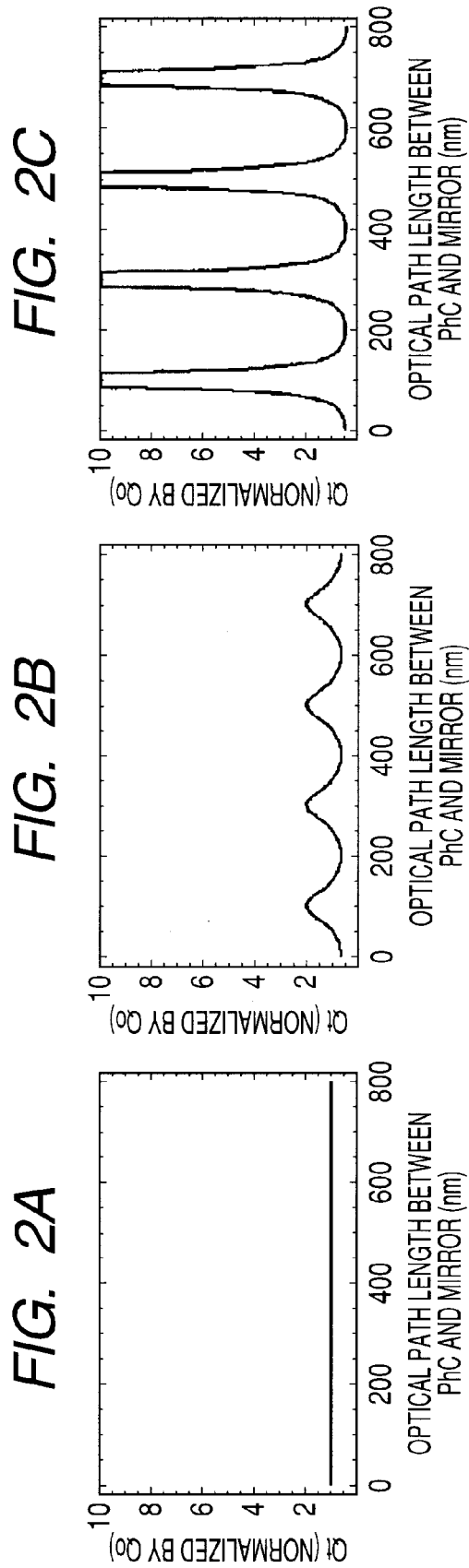
FIGS. 2A, 2B and 2C are graphs to describe the variation of a Q-value in an embodiment of the present invention.

FIG. 2 illustrates the results of Q-value calculations. FIG. 2 illustrates the variations of a Q-value when the optical path length (one-way) between the photonic crystal and the reflecting mirror is varied for three types of reflecting mirrors different in reflectance. FIG. 2A corresponds to a reflectance of 0%, FIG. 2B corresponds to a reflectance of 50%, and FIG. 2C corresponds to a reflectance of 100%. The wavelength of light used in the calculations is 400 nm. The axis of ordinates denotes Q-value normalized by the Q-value when no reflecting mirrors are provided ($Q_0$). Needless to say, the Q-value does not vary if the reflectance of a reflecting mirror is 0%. If the reflecting mirror has a reflectance value other than zero, then the Q-value varies depending on the optical path length. From FIGS. 2B and 2C, it is understood that the range of Q-value variation widens as the reflectance increases, and the Q-value varies over a range of ½ to the infinite at a reflectance of 100%. In addition, the variation is repeated with a period of a length corresponding to a half-wave length in the optical path length. From the abovementioned calculation results, it has been confirmed that the Q-value can be controlled by the intensity and phase (which are referred to as a complex amplitude) of reflected light.

The present invention has been accomplished by realizing arbitrary beam shapes by providing an arbitrary in-plane distribution to the intensity and phase of reflected light based on such knowledge and findings as described above, thereby providing an arbitrary in-plane distribution to the Q-value. That is, the laser of the present invention has an in-plane nonuniform structure in the spacer layer or the reflecting mirror.

FIG. 1, which represents a structure of the present embodiment, illustrates an example of providing an in-plane distribution to the intensity of reflected light. Arrows in the figure denote flows of light emitted in a surface normal direction from the two-dimensional photonic crystal 1010. A structure 1035 for reducing reflectance is provided on part of a reflecting mirror 1040 and, thereby, a nonuniform in-plane distribution is formed in the intensity of reflected light. As means for providing an arbitrary in-plane distribution to the intensity of reflected light other than modulating reflectance, light absorption at pathways of light before and after reflection, i.e., at the spacer layer, may be modulated. In order to modulate a coefficient of light absorption in the spacer layer, an impurity of some sort may be implanted by means of ion implantation or the like. Consequently, the amount of light absorption can be increased. On the other hand, in order to modulate the phase of reflected light in an in-plane direction, an optical path length may be modulated and, therefore, modulation may applied to one of the thickness and average refractive index of the spacer layer. Application of modulation to the refractive index of the spacer layer can be achieved by means of ion implantation, oxidization, modulation of a compound composition, temperature distribution, stress-induced density distribution, or the like. In the case of means, among the abovementioned means, which takes advantage of reversible change, the beam shape can be made variable. For example, in a configuration in which a heater is provided to form an in-plane temperature distribution or an in-plane stress distribution is formed using a piezoelectric element, the beam shape can be controlled in a reversible manner.

In a structure of the photonic crystal surface emitting laser of the present embodiment, the reflecting mirror or the spacer layer is an auxiliary element for applying modulation to the characteristics of the photonic crystal. That is, the photonic crystal surface emitting laser is structured so that laser oscillation is possible with a photonic crystal having no reflecting mirrors alone. In other words, the photonic crystal itself constitutes a laser resonator and laser oscillation is possible only with the photonic crystal. The abovementioned reflecting mirror or spacer layer is provided supplementarily, so that a Q-value, which is a resonator characteristic in a direction vertical to a substrate in a laser resonator based on the photonic crystal, has a nonuniform in-plane distribution. Accordingly, the photonic crystal and the reflecting mirror or the spacer layer can be designed independently of each other, thereby enabling design with a higher degree of freedom, compared with the laser light source of Patent Document 2.

As described above, the reflecting mirror or the spacer layer in the present embodiment is supplementarily provided in the laser resonator and is substantially different from a surface relief structure used in a vertical cavity surface emitting laser (VCSEL) described below. That is, as an example of controlling a laser beam shape by providing an in-plane distribution of some sort to the reflectance of a reflecting mirror, there is known a surface-relief structure used in a vertical cavity surface emitting laser (VCSEL). This example is such that an in-plane reflectance distribution is formed by forming an unlevel structure on a mirror surface provided by an emitting-side DBR of a vertical resonator comprised of a pair of DBRs. In the surface relief structure, unnecessary modes, among some inherently existent lateral modes, are cut off to leave only necessary modes (lowest-order mode referred to generally as a fundamental mode). Thus, the surface relief structure is able to obtain a beam shape having a specific mode. In contrast, in the present embodiment, the beam shape is controlled by modulating the in-plane resonator characteristic of a laser, which originally oscillates in a single mode, using one of the abovementioned supplementarily-provided reflecting mirror and spacer layer. Accordingly, the structure of the above-described present embodiment is substantially different in operating principles from the above-described surface relief structure of the VCSEL.

In the photonic crystal surface emitting laser of the present embodiment, an active layer similar to one used in a common semiconductor laser can be used for the active layer 1020. For example, the active layer is a multiquantum well structure formed using a material selected from the group consisting of GaAs/AlGaAs, GaInP/AlGaInP, GaN/InGaN, and the like. In addition, the spacer layer 1030 can be composed using one of a semiconductor and a dielectric material. The reflecting mirror 1040 can be composed using, for example, a DBR, a low-refractive index dielectric material, or a metal film. The substrate 1050 can be composed using, for example, a material selected from the group consisting of GaAs, GaN, Si, SiC, and sapphire.

In the photonic crystal surface emitting laser of the present embodiment, a plurality of laser elements can also be two-dimensionally disposed in an array within a plane. The size of each photonic crystal and the pitch at which these photonic crystals are disposed can be determined according to the purpose of use of the laser elements. For example, the size of each photonic crystal is 5 μm to 500 μm square and the pitch at which these photonic crystals are disposed is within a range of 10 μm to 1 mm. The laser may be composed so that the shapes of all beams emitted from the respective laser elements are the same or each laser element has a different beam shape. In addition, the photonic crystal surface emitting laser of the present embodiment can be driven by one of a light excitation method and a current injection method. Note that in FIG. 1, electrodes are omitted.

EMBODIMENTS

Hereinafter, embodiments of the present invention will be described.

Embodiment 1

A photonic crystal surface emitting laser according to the present embodiment will be described using FIG. 3.

Figure 3:
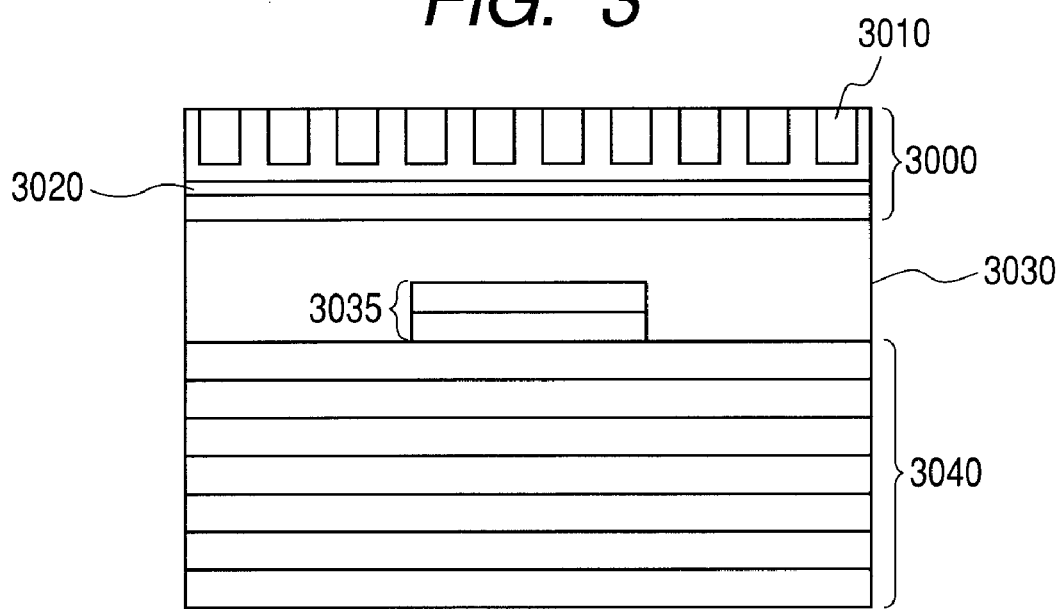
FIG. 3 is a schematic view used to describe a photonic crystal surface emitting laser in Embodiment 1 of the present invention.

The laser illustrated in FIG. 3 includes an optical waveguide layer 3000, a two-dimensional photonic crystal 3010, an active layer 3020, a spacer layer 3030, and a semiconductor DBR 3040. The two-dimensional photonic crystal 3010 is so structured that columnar holes are arranged in a square grid-like manner in p-type GaN which is a base material. The two-dimensional photonic crystal has a lattice constant of 160 nm, a hole diameter of 70 nm, and a hole depth of 200 nm. The active layer 3020 is made of an $In_{0.09}Ga_{0.91}N/In_{0.02}Ga_{0.98}N$ multiquantum well, the n-type spacer layer 3030 is made of $Al_{0.09}Ga_{0.91}N$, and the semiconductor DBR 3040 is made of GaN/AlN. Electrodes are omitted in the figure. This laser structure is designed so that laser oscillation takes place at a wavelength near 400 nm. As illustrated in FIG. 3, a projected portion 3035 is formed so that only the central portion of the laser has one more pair of DBRs, thus causing the spacer layer 3030 to be thinner at the central portion. As the result of providing the projected portion 3035 only in the central portion, the thickness of the spacer layer changes and the reflectance of DBRs, which are reflecting mirrors, also changes.

In the present embodiment, the height of the projected portion 3035 is approximately 80 nm, which is then multiplied by the refractive index of the spacer layer to give a product of approximately 200 nm. Since a round-trip optical path difference basically agrees with a wavelength, a phase difference of reflected light between the projected portion and the other portions need not be considered. As described above, reflectance varies as the number of DBR pairs varies.

Our calculations show that a reflectance of approximately 24% is obtained for 10 pairs of DBRs, and a reflectance of approximately 28% is obtained for 11 pairs of DBRs. If the number of DBR pairs is set to 11 at the projected portion 3035 and to 10 at a peripheral portion around the central portion, then there is obtained a Q-value difference of approximately 5% between the central portion and the peripheral portion. This difference causes a difference in oscillation threshold between the central portion and the peripheral portion. Consequently, if the laser is driven using a proper current value, there can be obtained a beam shape close to a unimodal one in which the light intensity is high at the central portion. On the other hand, if a projected portion is formed so that only the central portion has one less pair of DBRs, there can be obtained an annular beam shape the light intensity of which is high at the peripheral portion. This means that, in addition to a beam shape close to a unimodal one, arbitrary beam shapes can be realized by varying the structure of a reflecting mirror in the in-plane direction thereof.

Embodiment 2

Figure 4:
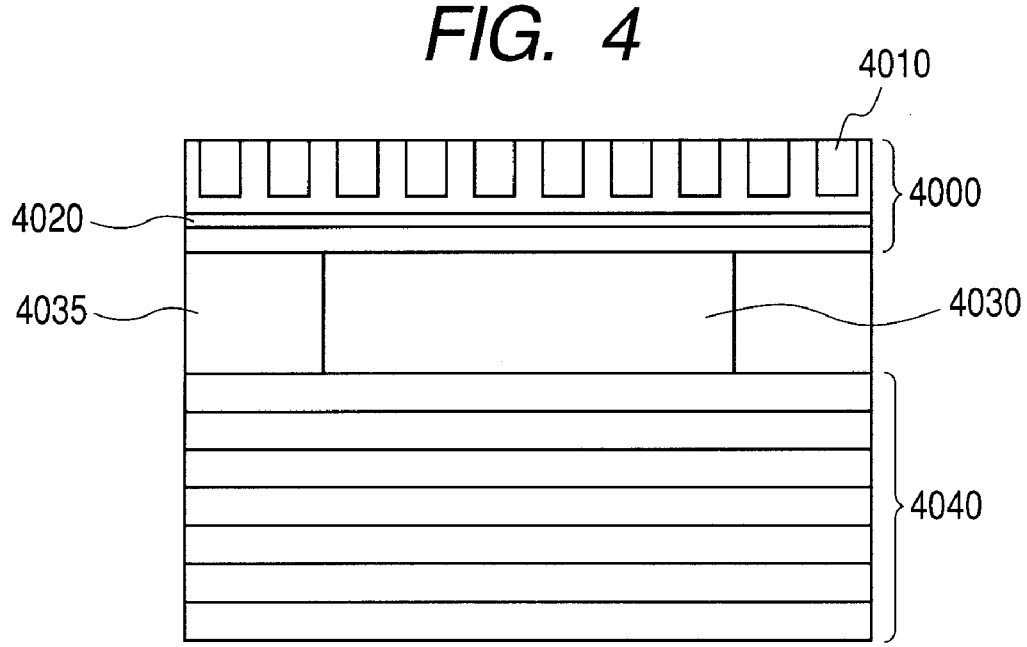
FIG. 4 is a schematic view to describe a photonic crystal surface emitting laser in Embodiment 2 of the present invention.

A photonic crystal surface emitting laser according to the present embodiment will be described using FIG. 4. The laser illustrated in FIG. 4 includes an optical waveguide layer 4000, a two-dimensional photonic crystal 4010, an active layer 4020, spacer layers 4030 and 4035, and a semiconductor DBR 4040. The photonic crystal surface emitting laser of the present embodiment is designed so that laser oscillation takes place at a wavelength near 400 nm. In FIG. 4, the in-plane structure of each reflecting mirror is uniform but that of the spacer layers are not uniform. Specifically, ion implantation is selectively performed so as to decrease the refractive index of only the spacer layer 4035 in the peripheral portion of a laser element. The source of ions to be implanted is, for example, Al.

If the refractive index differs, the optical path length also differs, even if the thickness of the spacer layers is uniform. Hence, the structure of the spacer layer is designed such that the Q-value is large at the central portion and then is shifted therefrom at the peripheral portion (desirably, by shifting the optical path length by a half-wave length). Consequently, laser oscillation less easily takes place at the peripheral portion than at the central portion. There is therefore obtained a beam shape close to a unimodal one in which the light intensity is high at the central portion. Also in the present embodiment, arbitrary beam shapes can be obtained. For example, the laser can be caused to emit beams in an annular shape by setting the refractive index distribution opposite to the above-mentioned distribution.

Embodiment 3

Figure 5:
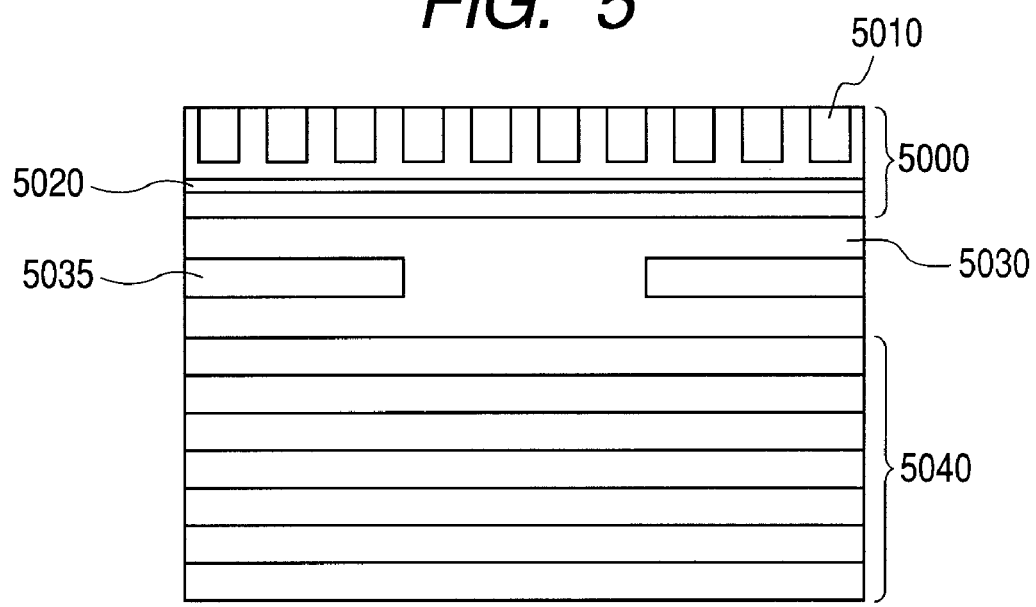
FIG. 5 is a schematic view to describe a photonic crystal surface emitting laser in Embodiment 3 of the present invention.

A photonic crystal surface emitting laser according to the present embodiment will be described using FIG. 5. The laser illustrated in FIG. 5 includes an optical waveguide layer 5000, a two-dimensional photonic crystal 5010, an active layer 5020, spacer layers 5030 and 5035, and a semiconductor DBR 5040. The photonic crystal surface emitting laser of the present embodiment is designed so that laser oscillation takes place at a wavelength near 400 nm. In FIG. 5, part of the spacer layer is oxidized to form an oxidized region 5035. In general, the refractive index of the oxidized part decreases and therefore the optical path length shortens. As a result, as with Embodiment 2, a nonuniform in-plane distribution can be formed in the optical path length, thereby enabling an arbitrary beam shape to be formed.

Embodiment 4

Figure 6:
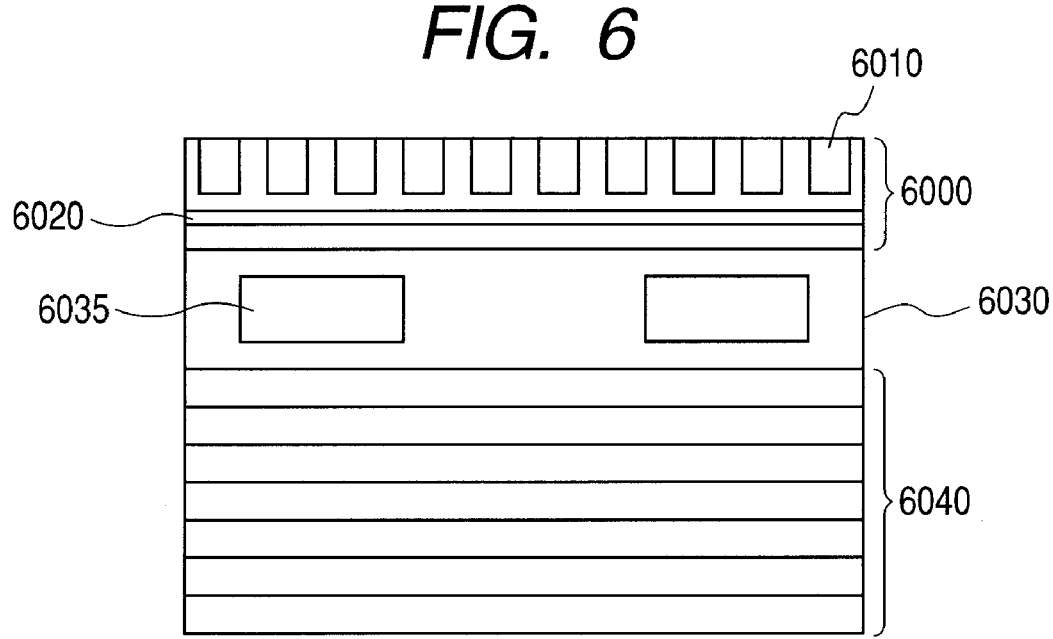
FIG. 6 is a schematic view to describe a photonic crystal surface emitting laser in Embodiment 4 of the present invention.

A photonic crystal surface emitting laser according to the present embodiment will be described using FIG. 6. The laser illustrated in FIG. 6 includes an optical waveguide layer 6000, a two-dimensional photonic crystal 6010, an active layer 6020, spacer layers 6030 and 6035, and a semiconductor DBR 6040. The photonic crystal surface emitting laser of the present embodiment is designed so that laser oscillation takes place at a wavelength near 400 nm. In FIG. 6, a compositionally-heterogeneous region 6035 is formed in the spacer layer 6030. For example, the spacer layer 6030 is formed of $Al_{0.07}GaN$ and the compositionally-heterogeneous region 6035 is formed of $Al_{0.20}GaN$. In an AlGaN-based compound semiconductor, a refractive index generally decreases as an Al composition becomes larger at longer wavelengths with respect to the absorption edge. That is, in the above-described structure, the spacer layer 6035 is lower in refractive index than the spacer layer 6030. As a result, as in Embodiments 2 and 3, a beam shape is controllable. Such a compositionally-heterogeneous region as mentioned above can be formed by means of patterning based on lithography or etching and embedded regrowth.

While embodiments of the present invention have been described heretofore, a surface emitting laser of the present invention is not limited to these embodiments. The shape, material and size of a photonic crystal, and materials constituting the active layer, clad layer and electrodes can be changed as appropriate within the scope of the present invention. In addition, while in the above-described embodiments, lasers having a laser oscillation wavelength of 400 nm have been shown, laser oscillation at an arbitrary wavelength is also possible by selecting an appropriate material and structure. Furthermore, in addition to the Gaussian unimodal and annular beam shapes discussed in the embodiments, arbitrary beam shapes can be obtained, including triangular, rectangular, semicircular, fan-shaped, and heart-shaped beam shapes. The above-described surface emitting lasers of the present invention can be used also as light sources for drawing images on a photosensitive drum included in an image forming apparatus, such as a copying machine or a laser printer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-112479, filed May 7, 2009, which is hereby incorporated by reference herein in its entirety.

The invention claimed is:

1. A photonic crystal surface emitting laser comprising:
   a photonic crystal having a resonance mode in an in-plane direction of a substrate;
   an active layer located in the vicinity of said photonic crystal and caused to emit light by carrier injection;
   a reflecting mirror for reflecting light from said photonic crystal in a normal direction, normal to the substrate; and
   a spacer layer interposed between said reflecting mirror and said photonic crystal,
   wherein a complex amplitude of reflected light reflected by said reflecting mirror to make a round trip in said spacer layer has a non-uniform in-plane distribution,
   wherein an intensity of the reflected light has a non-uniform in-plane distribution, and
   wherein said reflecting mirror is a DBR having a different number of pairs between a central portion and a peripheral portion so that a reflectance of said reflecting mirror has a non-uniform in-plane distribution.

2. The photonic crystal surface emitting laser according to claim 1, wherein said photonic crystal is two-dimensionally disposed in an array within a plane.

3. The photonic crystal surface emitting laser according to claim 1, wherein the number of DBR pairs at said central portion is larger than the number of DBR pairs at said peripheral portion.

4. The photonic crystal surface emitting laser according to claim 1, wherein the number of DBR pairs at said peripheral portion is larger than the number of DBR pairs at said central portion.

* * * * *